United States Patent
Fullam et al.

(10) Patent No.: US 11,171,051 B1
(45) Date of Patent: Nov. 9, 2021

(54) CONTACTS AND LINERS HAVING MULTI-SEGMENTED PROTECTIVE CAPS

(71) Applicant: International Business Machines Corporation, Armonk, NY (US)

(72) Inventors: Jennifer Fullam, Clifton Park, NY (US); Su Chen Fan, Cohoes, NY (US); Christopher J. Waskiewicz, Rexford, NY (US); Muthumanickam Sankarapandian, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/867,757

(22) Filed: May 6, 2020

(51) Int. Cl.
*H01L 21/768* (2006.01)
*H01L 23/522* (2006.01)

(52) U.S. Cl.
CPC .. *H01L 21/76877* (2013.01); *H01L 21/76802* (2013.01); *H01L 21/76843* (2013.01); *H01L 23/5226* (2013.01)

(58) Field of Classification Search
CPC ......... H01L 21/76877; H01L 21/76843; H01L 21/76802; H01L 23/5226
See application file for complete search history.

(56) References Cited

U.S. PATENT DOCUMENTS

| | | | |
|---|---|---|---|
| 6,261,950 B1 | 7/2001 | Tobben et al. | |
| 7,026,714 B2 | 4/2006 | Cunningham | |
| 9,209,073 B2 | 12/2015 | Yang et al. | |
| 9,741,609 B1 | 8/2017 | Cheng et al. | |
| 10,347,529 B2 * | 7/2019 | Liang | H01L 23/53228 |
| 2015/0235957 A1 | 8/2015 | Zhang et al. | |
| 2017/0077256 A1 | 3/2017 | Adusumilli et al. | |
| 2017/0278800 A1 | 9/2017 | Adusumilli et al. | |
| 2018/0096888 A1 * | 4/2018 | Naik | H01L 21/76849 |
| 2018/0130702 A1 | 5/2018 | Patil et al. | |

OTHER PUBLICATIONS

Fan et al., "Middle of Line RC Performance Study at the 7 nm Node," 2017 IEEE International Interconnect Technology Conference (IITC), IEEE, 2017, 3 pages.
Simon et al., "Electromigration Comparison of Selective CVD Cobalt Capping with PVD Ta(N) and CVD Cobalt Liners on 22nm-Groundrule Dual-Damascene Cu Interconnects," 2013 IEEE International Reliability Physics Symposium (IRPS), 2013, pp. 1-6.
Wu et al., "Cobalt CMP Development for 7nm Logic Device," ECS Transactions 77.5 (2017): 93-97.

* cited by examiner

*Primary Examiner* — Karen Kusumakar
(74) *Attorney, Agent, or Firm* — Cantor Colburn LLP; Erik Johnson

(57) ABSTRACT

Embodiments of the invention include a method of forming a multi-layer integrated circuit (IC) structure that includes forming a first layer of the multi-layered IC structure, wherein the first layer includes a trench having a liner and a conductive interconnect formed in the trench. The liner is formed such that it is not on a portion of a sidewall of the conductive interconnect. A multi-segmented cap is formed having a first cap segment and a second cap segment. The first cap segment is on a top surface of the conductive interconnect, and a first portion of the second cap segment is on the portion of the sidewall of the conductive interconnect. The second cap segment is on a top surface of the first cap segment.

20 Claims, 11 Drawing Sheets

CONTACTS AND LINERS HAVING MULTI-SEGMENTED PROTECTIVE CAPS

BACKGROUND

The present invention generally relates to fabrication methods and resulting structures for integrated circuit (IC) wafers. More specifically, the present invention relates to fabrication methods and resulting structures for a contact and liner structure having a multi-segmented protective cap configured to protect the contact and the liner during downstream IC fabrication operations.

ICs are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation; isolation; gate patterning; and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections are formed above these logical and functional layers during the BEOL stage to complete the IC. Most ICs need more than one layer of wires to form all the necessary connections, and as many as 5-12 layers are added in the BEOL process. The various BEOL layers are interconnected by conductive via structures that couple from one layer to another.

To mitigate electromigration in BEOL structures, a capping layer is typically formed over the interconnect structures. The capping layer serves to inhibit diffusion, oxidation, and/or electromigration from the top surface of the conductive interconnect structures, as well as to prevent oxidation of the conductive interconnect structures.

SUMMARY

Embodiments of the invention are directed to a method of forming a multi-layer integrated circuit (IC) structure. A non-limiting example of the method includes forming a first layer of the multi-layered IC structure, wherein the first layer includes a trench having a liner and a conductive interconnect formed in the trench. The liner is formed such that it is not on a portion of a sidewall of the conductive interconnect. A multi-segmented cap is formed having a first cap segment and a second cap segment. The first cap segment is on a top surface of the conductive interconnect, and a first portion of the second cap segment is on the portion of the sidewall of the conductive interconnect. The second cap segment is on a top surface of the first cap segment.

Embodiments of the invention are directed to a method of forming a multi-layer IC structure. A non-limiting example of the method includes forming a first layer of the multi-layered IC structure, wherein the first layer includes a trench having a liner and a conductive interconnect formed in the trench. The liner is not on a portion of a sidewall of the conductive interconnect. The liner is also not on a portion of a sidewall of the first layer. A protective cap is formed by selectively depositing a first segment of the protective cap such that the first segment adheres to a top surface of the conductive interconnect but does not adhere to the liner. Forming the protective cap further includes selectively depositing a second segment of the protective cap such that the second segment adheres to a sidewall surface of the conductive interconnect; presses against but does not adhere to the portion of the sidewall of the first layer; and is positioned over but does not adhere to the liner.

Embodiments of the invention are directed to a multi-layer IC structure. A non-limiting example of the multi-layer IC structure includes forming a first IC layer of the multi-layered IC structure, wherein the first IC layer includes a trench having formed therein a liner and a conductive interconnect. The liner is not on a portion of a sidewall of the conductive interconnect. The liner is also not on a portion of a sidewall of the first layer. The protective cap has a first cap segment and a second cap segment. The first cap segment of the protective cap is adhered to a top surface of the conductive interconnect but not adhered to the liner. The second segment of the protective cap is adhered to a sidewall surface of the conductive interconnect; pressed against but not adhered to the portion of the sidewall of the first layer; and positioned over but not adhered to the liner.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-8 depict portions of an IC wafer after fabrication operations for forming a contact and liner structure having a multi-segmented protective cap configured to protect the contact and the liner during downstream IC fabrication operations, in which:

FIG. 1A depicts a portion of an IC wafer after fabrication operations have been performed in accordance with aspects of the invention;

FIG. 2 depicts a portion of an IC wafer after fabrication operations have been performed in accordance with aspects of the invention;

FIG. 3 depicts a portion of an IC wafer after fabrication operations have been performed in accordance with aspects of the invention;

FIG. 4 depicts a portion of an IC wafer after fabrication operations have been performed in accordance with aspects of the invention;

FIG. 5 depicts a portion of an IC wafer after fabrication operations have been performed in accordance with aspects of the invention;

FIG. 6 depicts a portion of an IC wafer after fabrication operations have been performed in accordance with aspects of the invention;

FIG. 7 depicts a portion of an IC wafer after fabrication operations have been performed in accordance with aspects of the invention; and FIG. 8 depicts a portion of an IC wafer after fabrication operations have been performed in accordance with aspects of the invention; and FIGS. 9A-9B depict portions of an IC wafer after fabrication operations for forming a contact and liner structure having a protective cap configured to protect the contact and the liner during downstream IC fabrication operations, in which:

FIG. 9A depicts a portion of an IC wafer after fabrication operations have been performed in accordance with aspects of the invention; and FIG. 9B depicts a portion of an IC wafer after fabrication operations have been performed in accordance with aspects of the invention.

Figure 1A:
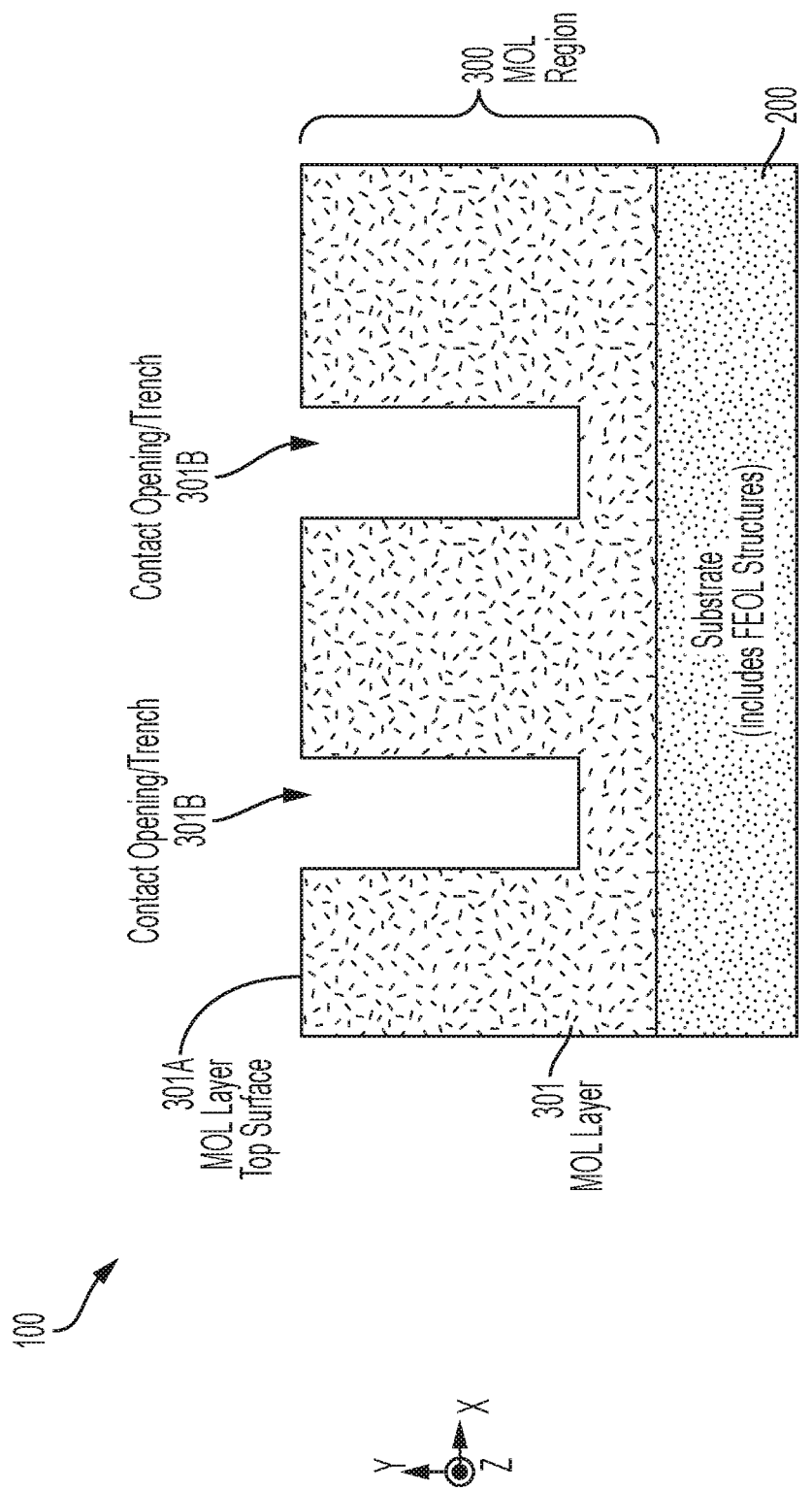

The diagrams depicted herein are illustrative. There can be many variations to the diagram, or the operations described therein without departing from the spirit of the invention. For instance, the actions can be performed in a differing order or actions can be added, deleted or modified. Also, the term "coupled", and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic and electro-optical applications. ICs are typically formed from various circuit configurations of semiconductor devices (e.g., transistors, capacitors, resistors, etc.), conductive contacts, and conductive interconnect layers (known as metallization layers) formed on semiconductor wafers. Alternatively, semiconductor devices can be formed as monolithic devices, e.g., discrete devices. Semiconductor devices, contacts, and conductive interconnect layers are formed on semiconductor wafers by depositing many types of thin film materials over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the individual components fabricated during the FEOL stage. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metal layers, complex ICs can have ten or more BEOL layers of wiring.

The term "interconnect" is used herein to refer to contacts and related signal transmission structures formed in the MOL layers, as well as via structures, lines, and other signal transmission structures formed in the BEOL layers. Interconnect structures are often formed in a stack. For example, a transistor can have a gate contact (also referred to as a CB contact) and S/D contacts (also referred to as CA contacts). The S/D contacts can extend from a metal wire or a metal via in the BEOL region, through an interlayer dielectric (ILD) in the MOL region, and to metal plugs (also referred to as trench silicide (TS) contacts) positioned on S/D contact surfaces of the S/D regions.

Interconnect structures close to the transistors need to be small because they attach to the components (e.g., S/D and/or gate contact surfaces) that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Conductive vias connected between interconnect levels allow signals and power to be transmitted from one layer to the next. For example, a through-silicon via (TSV) is a conductive via that passes completely through a given semiconductor wafer or die. In multilevel IC configurations, for example, a TSV can be used to form vertical interconnections between a semiconductor device located on one level of the IC and an interconnect layer located on another level of the IC.

Although MOL interconnects are fabricated before BEOL interconnects, MOL interconnect surfaces must be exposed during fabrication of BEOL interconnects in order to make the necessary electrical connections between the BEOL interconnect-under-fabrication and the already-formed MOL interconnect. Unless the exposed portion of the MOL interconnect is properly protected, BEOL etch operations that are selective to MOL interconnect material can unintentionally etch and/or attack the exposed portions of the MOL interconnect, thereby degrading performance of the MOL interconnect.

Turning now to an overview of the aspects of the invention, embodiments of the invention provide fabrication methods and resulting structures for a contact and liner structure having a multi-segmented protective cap configured to protect the contact and the liner from being etched or attacked during downstream IC fabrication operations. In aspects of the invention, the contact/liner are an MOL interconnect, and the downstream fabrication operations form a BEOL line/via and couple it to the MOL contact/liner. In some embodiments of the invention, the protective cap is a multi-segmented protective cap having at least a first protective cap segment and a second protective cap segment configured and arranged in a upside down bowl shape that enables the multi-segmented protective cap to protect both top surfaces and sidewall surfaces of the MOL contact/liner. In some embodiments of the invention, the protective cap is a unitary protective cap configured and arranged in a upside down bowl shape that enables the unitary protective cap to protect both top surfaces and sidewall surfaces of the MOL contact/liner.

In accordance with aspects of the invention, prior to fabrication of the BEOL interconnect, the first protective cap segment is selectively deposited on an exposed surface of the MOL contact. In accordance with aspects of the invention, the first protective cap segment is a conductive material that will selectively deposit on another conductive material but will not selectively deposit on an insulator (e.g., a dielectric) or a high resistance metal or metal alloy (e.g., TiN). Accordingly, in embodiments of the invention where the MOL liner is a high resistance material, the first protective cap segment deposits on the exposed surface of the MOL contact but does not deposit on an exposed surface of the MOL liners. In some embodiments of the invention, prior to deposition of the second protective cap segment, an additional conductive surface is exposed by recessing the MOL liner to expose sidewall surfaces of the first protective cap segment. In some embodiments of the invention, prior to deposition of the second protective cap segment, the MOL liner is recessed to expose sidewall surfaces of the first protective cap segment and sidewall surfaces of the MOL contact. In accordance with aspects of the invention, the second protective cap segment is also a conductive material that will selectively deposit on another conductive material but will not selectively deposit on an insulator (e.g., a dielectric) or a high resistance metal or metal alloy (e.g., TiN). Accordingly, the second protective cap segment deposits on the exposed sidewall surfaces of the first protective cap segment and is positioned over the MOL liner to protect the MOL liner. In embodiments of the invention where the MOL liner is recessed sufficiently to expose sidewall surfaces of the first protective cap segment and sidewall surfaces of the MOL contact, the second protective cap segment deposits on sidewalls of the first protective cap segment and on sidewalls of the MOL contact such that the second protective cap segment is positioned over and protects the recessed MOL liner. Accordingly, in embodiment of the invention where the MOL liner is recessed sufficiently to expose sidewall surfaces of the first protective cap segment and sidewall surfaces of the MOL contact, the second protective cap segment is deposited on the sidewalls of the MOL contact resulting in the portion of the second protective cap segment that covers the first protective cap segment having a substantially non-planar or curved top surface.

In embodiment of the invention, the protective cap segments can include conductive metals, including but not limited to copper, cobalt, tungsten, ruthenium, and alloys thereof. In aspects of the invention, the first protective cap segment can include the same or different materials than the second protective cap segment. In aspects of the invention, the conductivity of the protective cap segments can be enhanced through adding dopants to one or both of the protective cap segments. In some embodiments of the invention, a thickness of the first protective cap segment is about 1-15 nm. In some embodiments of the invention, a thickness of the second protective cap segment is about 1-20 nm.

In embodiments of the invention, the MOL liner can be formed from a metal nitride, including but not limited to tantalum nitride (TaN) and titanium nitride (TiN).

Turning now to a more detailed description of aspects of the present invention, FIGS. 1A-8 depict the results of a fabrication method for forming a multi-layered IC wafer 100 having a novel multi-segmented protective cap 410 (shown in the exploded/isolation view of region 402 in FIG. 4) in accordance with embodiments of the invention. A variety of known fabrication operations are suitable for forming the multi-layered IC wafer 100 shown in any of the FIGS. 1A-8. Accordingly, in the interest of brevity, such well-known fabrication operations are either omitted or described and illustrated at a high level. Although the wafer 100 is depicted in two (2) dimensions, the x/y/z axis shown in the figures is to identify that the wafer 100 in fact extends in three (3) dimensions.

FIG. 1A illustrates a portion of a multi-layered IC wafer 100 after an initial set of fabrication operations have been performed in accordance with aspects of the invention. At the fabrication stage shown in FIG. 1A, the multi-layered IC wafer 100 includes a substrate 200 and an MOL region 300, configured and arranged as shown. In embodiments of the invention, the substrate 200 includes FEOL structures formed therein or thereon. Fabrication operations such as wafer preparation, isolation, and gate patterning have been used to form the FEOL structures of the substrate 200. The FOEL structures can include structures such as wells, S/D regions, extension junctions, silicide regions, liners, and the like.

Referring still to FIG. 1A, the MOL region 300 includes an MOL layer 301, which can be formed by depositing a bulk dielectric over the substrate and planarizing the MOL layer 301 to form an MOL layer top surface 301A. Known fabrication methods are used pattern and etch the MOL layer 301 to form therein an initial set of contact openings/trenches 301B.

Figure 1B:
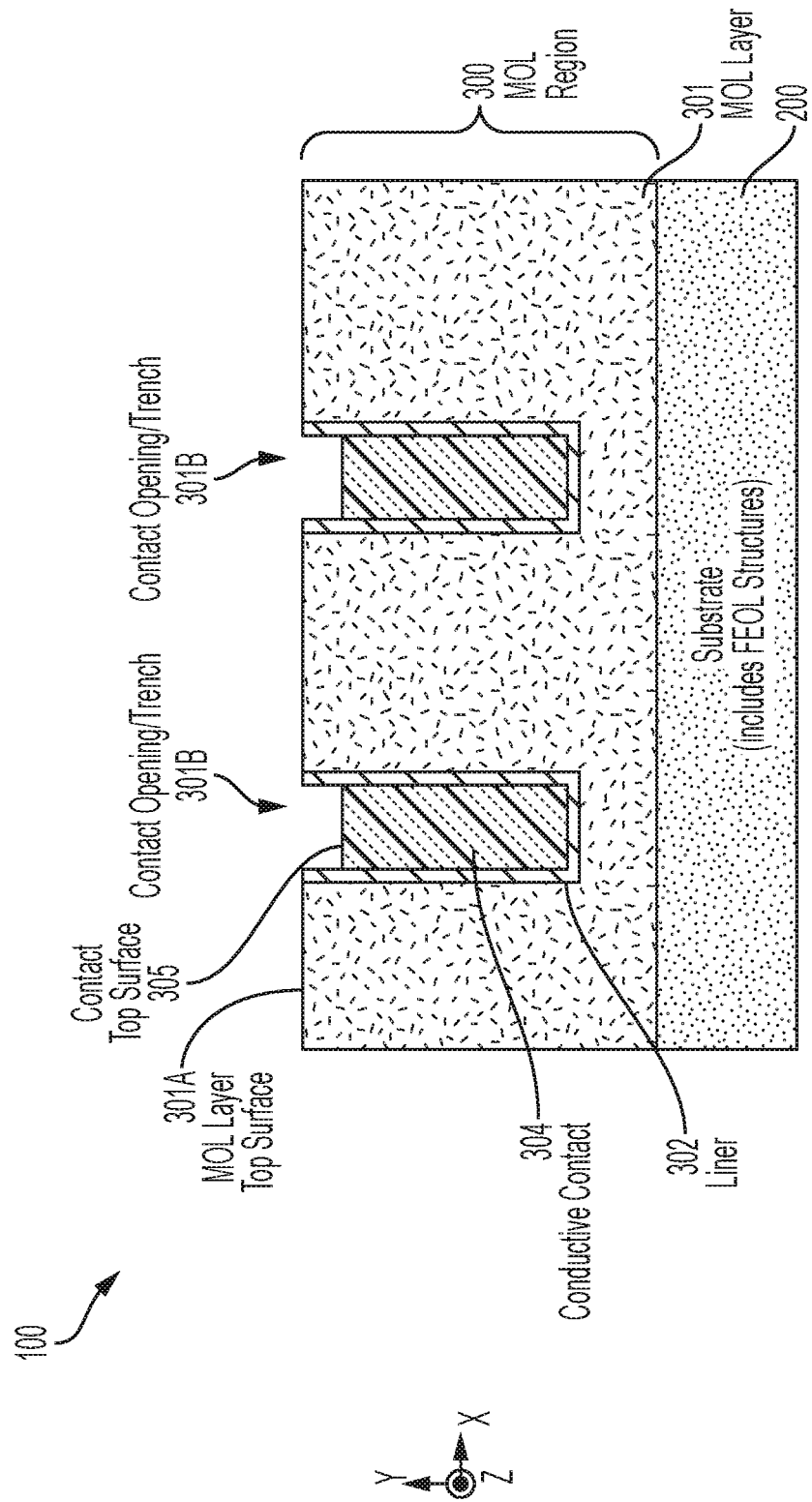
FIG. 1B depicts a portion of an IC wafer after fabrication operations have been performed in accordance with aspects of the invention.

In FIG. 1B, liners 302 and the contacts 304 are formed in the contact openings/trenches 301B (best shown in FIG. 1A) by depositing the liners 302 in the contact trenches 301B. The remaining portions of the contact trenches 301B are filled with a conductive material (e.g., metal) to create the contacts 304. In accordance with aspects of the invention, contact top surfaces 305 of the contacts 304 have been recessed to expose sidewall of the liners 302 and reopen portions of the contact openings/trenches 301B. In aspects of the invention the contact top surfaces 305 can be recessed up to 1 to 20 nanometers lower than the MOL layer top surface 301A. In aspects of the invention, the contacts 304 can be a conductive metal such as copper, cobalt, and the like. In aspects of the invention, the MOL layer 301 can be formed from a low-k dielectric (e.g., k less than about 4), an ultra-low-k (ULK) dielectric (e.g., k less than about 2.5), and the like.

Figure 2:
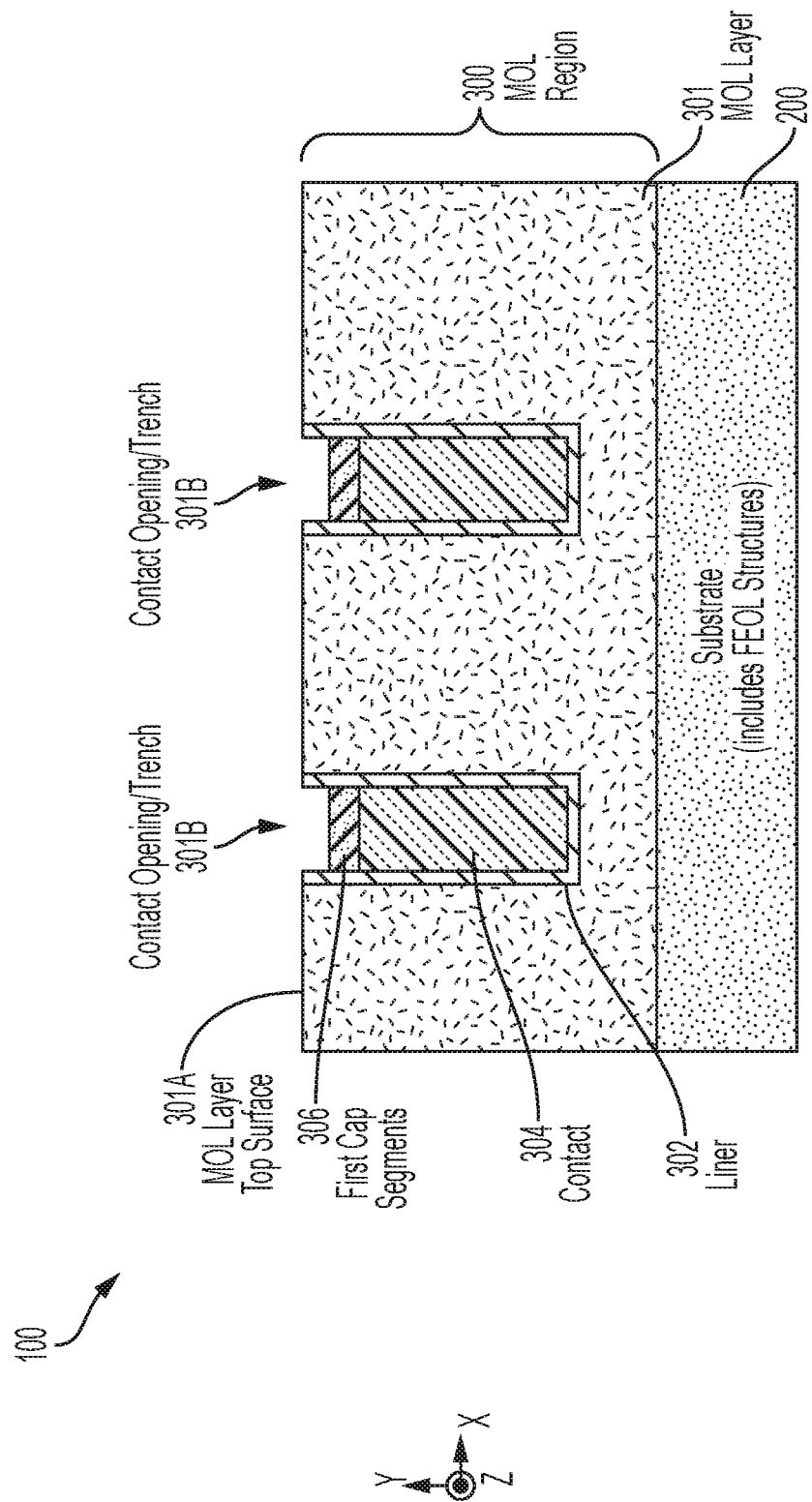

In FIG. 2, known semiconductor fabrication operations (e.g., electroplating) have been used to deposit first protective cap segments 306 on the contact top surfaces 305 (best shown in FIG. 1B). In embodiments of the invention, the first protective cap segments 306 are formed from conductive material(s). In embodiments of the invention, the conductive material is a material that qualifies as (or can serve as) a conductor of electricity (e.g., a metal) and does not qualify as (or cannot serve as) an insulator (e.g., a dielectric) or a high resistance material (e.g., TiN or TaN). Suitable conductive materials for the first protective cap segments 306 include but are not limited to copper, cobalt, tungsten, ruthenium and alloys thereof. In accordance with aspects of the invention, the first protective cap segments 306 are formed from conductive material(s) that will selectively form on and adhere to another conductive material but will not selectively adhere to insulators (e.g., a dielectric) and high resistance material (e.g., TiN and/or TaN). Accordingly, when the conductive material of the first protective cap segments 306 is deposited, it adheres selectively to the contact top surfaces 305 but does not adhere to the liners 302. The first protective cap segments 306 can be deposited using any suitable process for selectively depositing conductive material including but not limited to electroplating.

Figure 3:
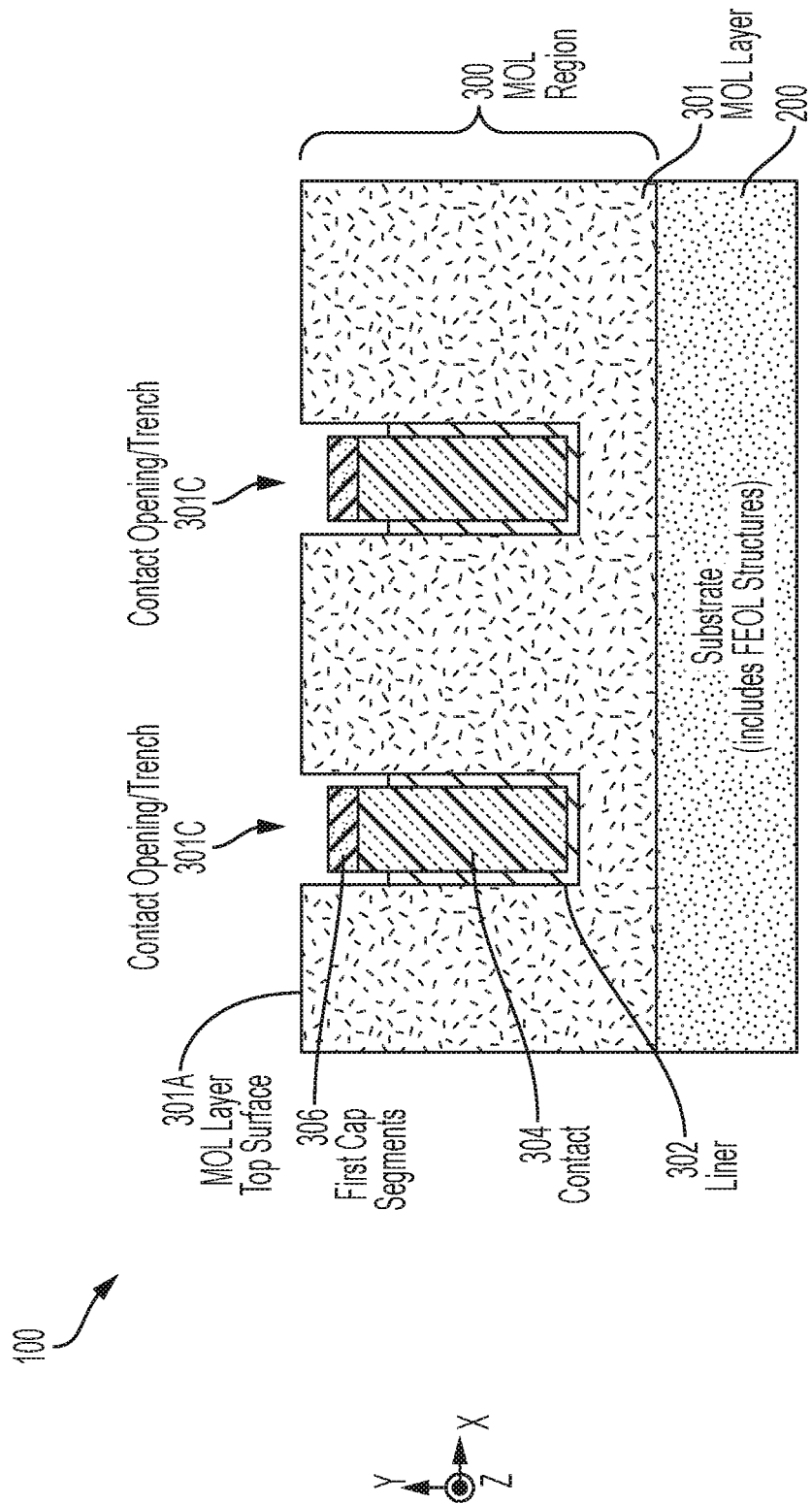

FIG. 3 depicts the wafer 100 after a selective etching operation has been employed to etch the liner layers 302. In accordance with the aspects of the invention, the liner layers 302 can be etched lower than the contact top surfaces 305, thereby exposing sidewall surfaces of the first protective cap segment 306, and also exposing sidewall surfaces of the contacts 304. The liners 302 can be etched using any suitable dry or wet etching process, including, for example, a RIE process that uses an etchant including $NF_3$ and $SF_6$. In some aspects of the invention, the RIE etchant can be configured to etch the liners 302 without also attacking the exposed sidewalls of the contacts 304 by increasing $NF_3$ and decreasing $SF_6$ in comparison to the amount of $NF_3$ and $SF_6$ that would be present in a liner etchant that etches the liners 302 and attacks the material from which the contacts 304 are formed. Etching the liners 302 results in the formation of contact openings/trenches 301C having the shape of a bowl or other open-ended container that has been turned upside down. In aspects of the invention, the shape of the contact openings/trenches 301C in the z/x plane tracks the shape of the contacts 304 in the z/x plane. For example, if each contact 304 is circular (or rectangular, square, etc.) in the z/x plane, the shape of the corresponding contact opening/trench 301C is also circular (or rectangular, square, etc.) in the z/x plane. In embodiments of the invention, portions of the contact openings/trenches 301C extend around a circumference of the contacts 304 in the x/z plane.

Figure 4:
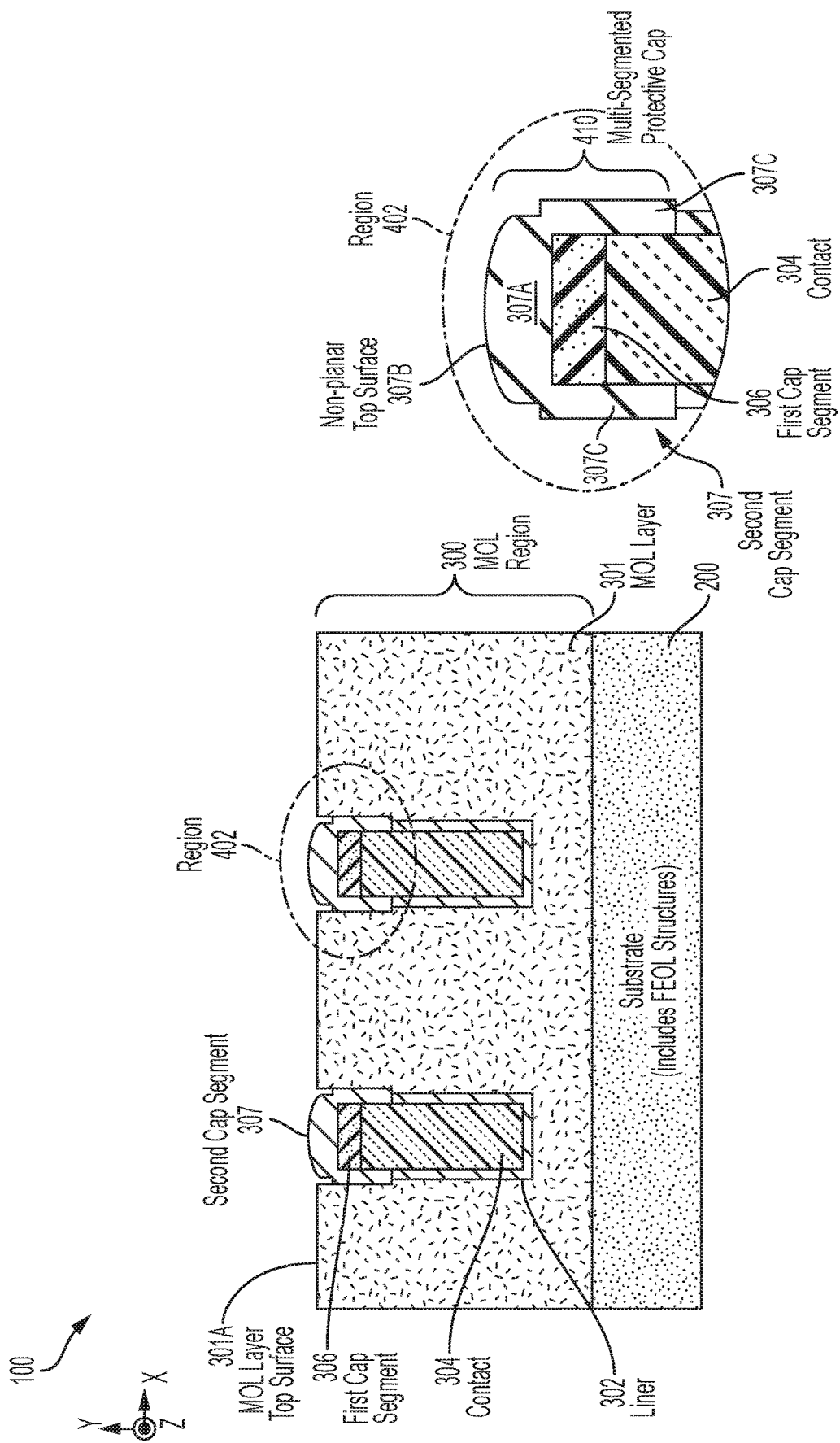

FIG. 4 depicts the wafer 100 after known semiconductor fabrication operations (e.g., electroplating) have been used to deposit second protective cap segments 307 within the openings/trenches 301C (best shown in FIG. 3) in accordance with aspects of the invention. In embodiments of the invention, similar to the first protective cap segments 306, the second protective cap segments 307 are formed from conductive material(s). In embodiments of the invention, the conductive material is a material that qualifies as (or can be used as) a conductor of electricity (e.g., a metal) and that does not qualify as (or cannot be used as) an insulator (e.g., a dielectric) or a high resistance material (e.g., TiN or TaN). Suitable conductive materials for the second protective cap segments 307 include but are not limited to copper, cobalt, tungsten, ruthenium and alloys thereof. In accordance with aspects of the invention, the second protective cap segments 307 are formed from conductive material that will selectively form on and adhere to another conductive material but will not selectively adhere to insulators (e.g., a dielectric) and high resistance material (e.g., TiN and/or TaN). Accordingly, when the conductive material of the second protective cap segments 307 is deposited, it adheres selectively to top surfaces and sidewalls of the first protective cap segment 306 (a conductor), as well as to exposed sidewalls of the contact 304 (a conductor), but does not adhere to the liners 302 (e.g., high resistance TiN) and the bulk dielectric material of the MOL layer 301 (an insulator).

In accordance with aspects of the invention, although the second protective cap segments 307 do not adhere to the liners 302 and the MOL layer 301, the selective deposition process of the second protective cap segment 307 is continued until the second protective cap segment 307 is sufficiently pressed against the bulk dielectric material of the MOL layer 301 to prevent wet/dry etchants (e.g., BEOL etchants 702 shown in FIG. 7) from passing between the second protective cap segment 307 and the MOL layer 301 to attack the liner 302 positioned underneath the second protective cap segment 307. For example, in downstream BEOL fabrication operations that require etching of a hardmask formed from the same material as the liners 302, portions of the second protective cap segments 307 are sufficiently pressed against the MOL layer 301 to prevent etchants used to etch the BEOL hardmask from passing between the second protective cap segment 307 and the MOL layer 301 to attack the liner 302 positioned underneath portions of the second protective cap segment 307. In some embodiments of the invention, the second protective cap segment 307 is sufficiently pressed against the bulk dielectric material of the MOL layer 301 such that the portion of the second protective cap segment 307 that is formed above the liner 302 is wider than the liner 302. The second protective cap segment 307 can be deposited using any suitable process for selectively depositing conductive material including but not limited to electroplating.

FIG. 4 also depicts a region 402 of the IC wafer 100, as well as an exploded/isolated view of the region 402. The exploded/isolated view of region 402 depicts additional details of the multi-segmented protective cap 410 formed from the first protective cap segment 306 and the second protective cap segment 307. The second protective cap segment 307 includes an upper sub-segment (or region) 307A and leg sub-segments (or regions) 307C. In the exploded/isolated view of region 402, the multi-segmented protective cap 410 is adhered to the contact top surface 305 (shown in FIG. 1B) and portions of the sidewalls of the contact 304. More specifically, in accordance with aspects of the invention, the first protective cap segment 306 is adhered to the contact top surface 305; the upper sub-segment 307A is adhered to a top surface of the first cap segment 306; and the leg sub-segments 307C are adhered to sidewalls of the first cap segment 306 and portions of the sidewalls of the contact 304. In accordance with aspects of the invention, the multi-segmented protective cap 410 (and more specifically the leg sub-segments 307C) is present above the liner 302 to protect the liner 302 from downstream fabrication operations. In some embodiments of the invention, deposition of the second protective cap segment 307 presses the leg sub-segments 307C against the bulk dielectric material of the MOL layer 301 sufficiently to result in the leg sub-segments 307C formed above the liners 302 being wider than the liners 302.

Accordingly, in embodiments of the invention where the liner 302 is around the circumference (e.g., in the z-x plane) of the contact 304, the multi-segmented protective cap 410 is also around the circumference of the contact 304. In some embodiments of the invention, dopants are added to the conductive materials that form the multi-segmented protective cap 410 using any suitable known process. Providing dopants in the multi-segmented protective cap 410 improves the etch resistance of the cap 410 to etchants used in downstream (e.g., BEOL) fabrication operations. For example, in embodiments of the invention where the multi-segmented cap 410 includes tungsten, adding boron to the tungsten or nitrating the tungsten makes the cap 410 more resistance to wet etchants used in BEOL fabrication operations.

In accordance with aspects of the invention, the upper sub-segment 307A of the second protective cap segment 307 includes a non-planar top surface 307B. In some aspects of the invention the non-planar top surface 307B is curved, which results from the unique shape of the contact opening/trench 301C (shown in FIG. 3) in which the second protective cap segment 307 is formed. As previously noted herein, etching the liners 302 results in the contact openings/trenches 301C having the shape of a bowl or other open-ended container that has been turned upside down. During deposition of the conductive material that forms the second protective cap segment 307, the conductive material filling in the spaces of the contact opening/trench 301C along sidewalls of the first protective cap segment 306 and the contact 304 causes the top surface 307B to be substantially non-planar, irregularly-shaped, and/or curved.

In some embodiments of the invention, the multi-segmented protective cap 410 (shown in FIG. 4) can be implemented as a unitary protective cap structure formed using one deposition operation instead of the multiple deposition operations used to form the multi-segmented implementation of the protective cap 410. For example, in some embodiments of the invention, the deposition of the first cap segments 306 in FIG. 2 can be skipped, and the liner etch/recess operations shown in FIG. 3 can follow the contact recess operations shown in FIG. 1B. The liners 302 can be etched using any suitable dry or wet etching process, including, for example, a RIE process that uses an etchant including $NF_3$ and $SF_6$. In some aspects of the invention, the RIE etchant can be configured to etch the liners 302 without also attacking the exposed sidewalls of the contacts 304 by increasing $NF_3$ and decreasing $SF_6$ in comparison to the amount of $NF_3$ and $SF_6$ that would be present in a liner etchant that etches the liners 302 and attacks the material from which the contacts 304 are formed. In some embodiments of the invention, the exposed surfaces of the contact 304 are protected from the etchant used to recess the liner 302. Any suitable contact surface protection method can be used then removed prior to deposition of the unitary implementation of the protective cap 410.

Figure 5:
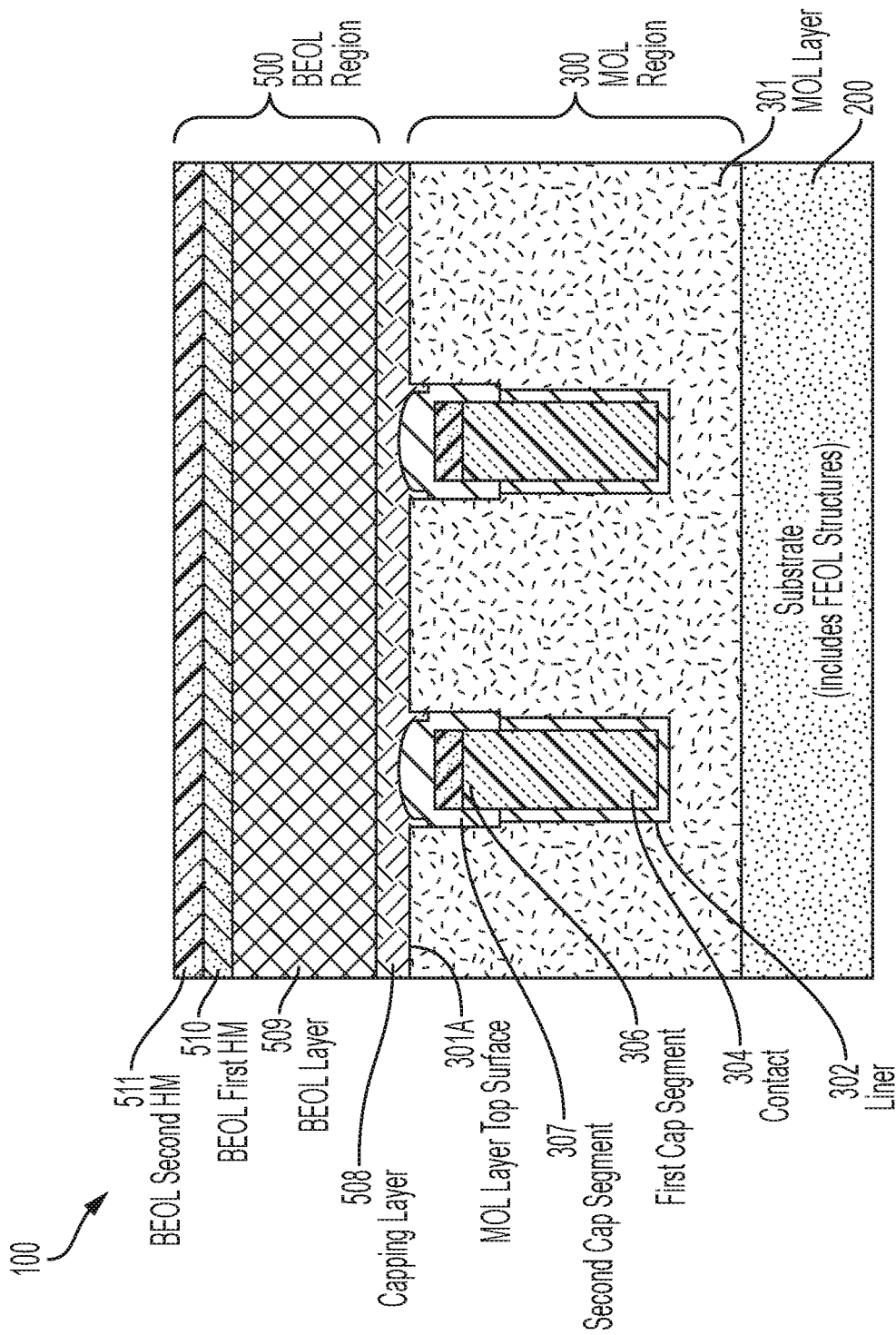

In FIG. 5, known semiconductor fabrication operations have been used to deposit a capping layer 508 (e.g., SiN, SiNCH, SiCN, SiOCN, SiBCN) over the MOL region 500. The capping layer 508 prevents the electro-migration and/or diffusion of the conductive material (e.g., the second protective cap segment 307) into a subsequently deposited dielectric material (e.g., BEOL interlayer dielectric (ILD) layer 509). Additionally, the capping layer 508 provides adhesion between the layer(s) that form the MOL region 300 and the layer(s) that form the BEOL region 500. Known semiconductor fabrication operations have also been used to form layers of a BEOL region 500 over the capping layer 508. The BEOL region 500 includes the BEOL ILD layer 509, a BEOL first hard mask layer 510, and a BEOL second hard mask layer 511, configured and arranged as shown. In some aspects of the invention, the BEOL ILD layer 509 is a low-k ILD material. In some aspects of the invention, the first hard mask layer 510 is formed from an insulator material (e.g., a dielectric). In some embodiments of the invention, the second hard mask layer 511 is formed from a high resistance material (e.g., TiN and/or TaN) that is substantially the same as the material used to form the liners 302.

Figure 6:
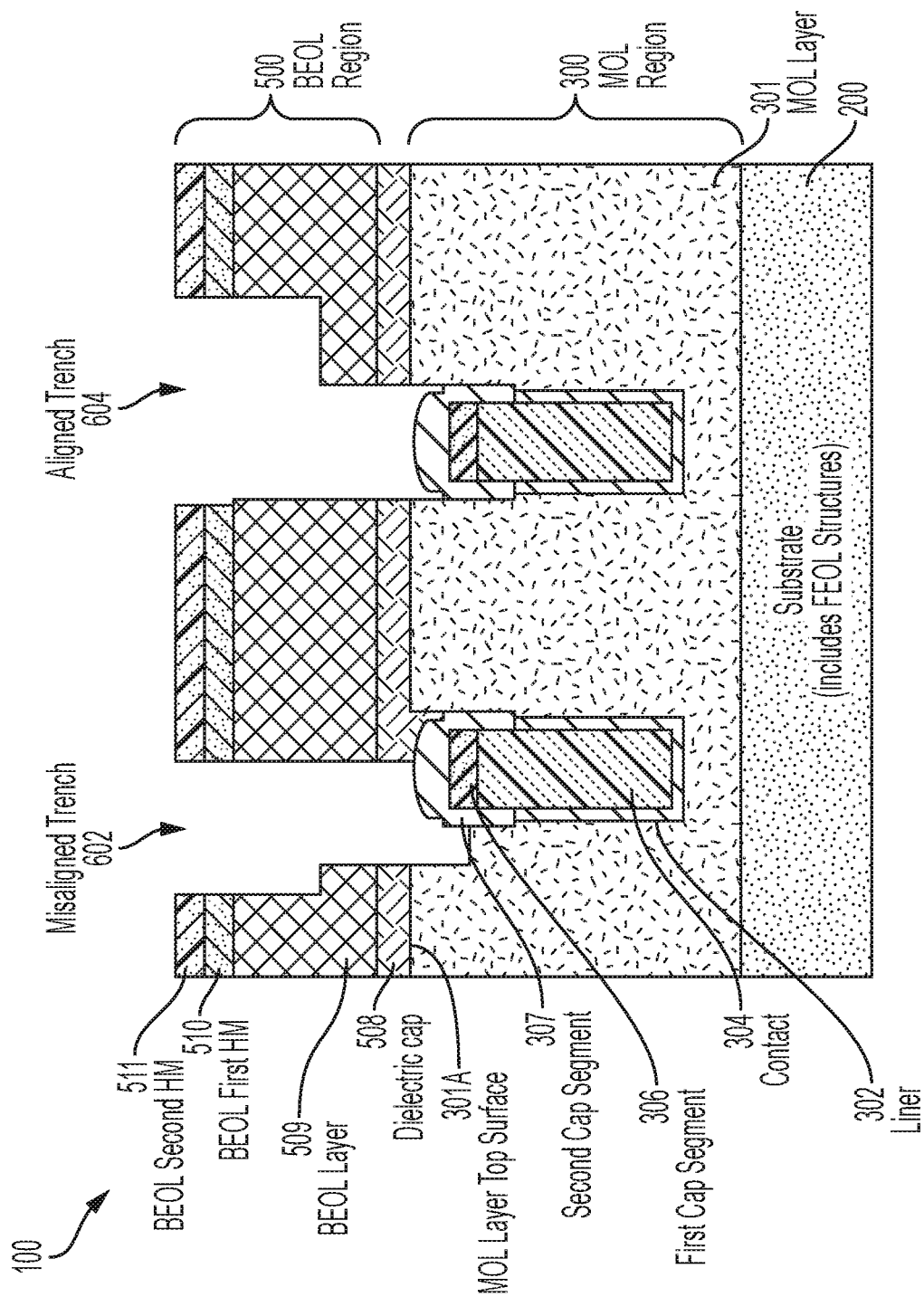

In FIG. 6, known semiconductor fabrication operations have been used to form openings/trenches 602, 602 using, for example, a so-called dual damascene process in which a single trench defines the dimensions for both the conductive via portion of the interconnect and the line portion of the of interconnect. In embodiments of the invention, a lower region of each of the dual damascene openings/trenches 602, 604 defines the dimensions of to-be-formed conductive BEOL vias, and an upper region of each of the dual damascene openings/trenches 602, 604 defines the dimensions of to-be-formed conductive BEOL lines. In embodiments of the invention, the first and second hardmasks 510, 511 are lithographically patterned and etched to expose portions of the BEOL ILD layer 509 that define the footprint of the dual damascene trench 602 and the footprint of the dual damascene trench 604. Reactive ion etch (RIE) processes are applied to etch through the exposed portions of the BEOL ILD layer 509, thereby exposing the second cap segment 307 and creating the dual damascene opening/trench 602 and the dual damascene opening/trench 604. In accordance with aspects of the invention, the second cap segment 307 and the first cap segment 306 protect the line 302 and the cap 304 from being damaged by the RIE processes used to form the dual damascene openings/trenches 602, 604. Due to errors in known lithography processes, some portion of the pattern applied to the hard masks 510, 511 can be misaligned, which results in some of the dual damascene openings/trenches being misaligned. As shown in FIG. 6, the dual damascene trench 602 is an example of a misaligned opening/trench, and the dual damascene opening/trench 604 is an example of an aligned opening/trench.

Figure 7:
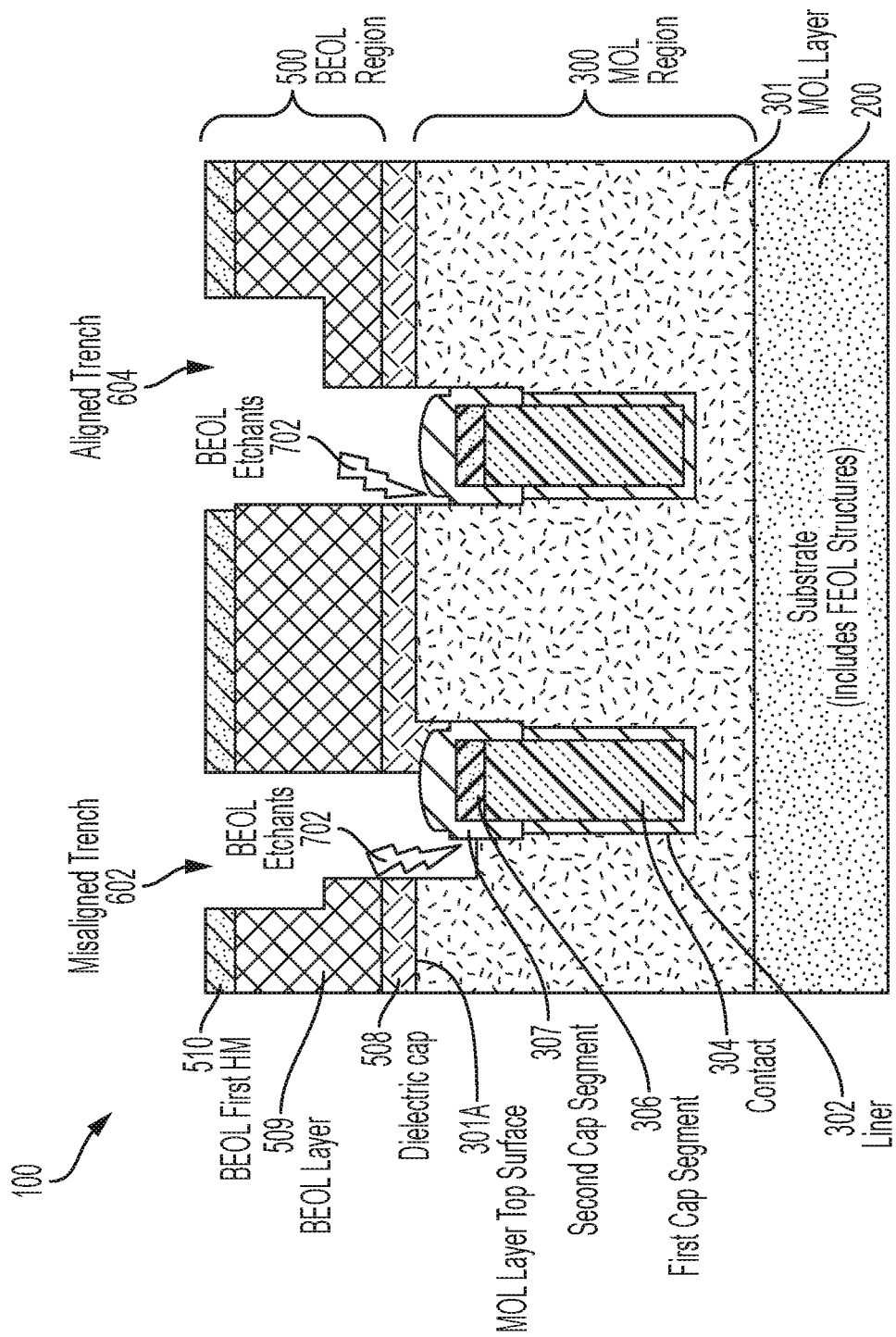

In FIG. 7, known semiconductor fabrication operations have been used to etch the second hard mask layer 511 (shown in FIG. 6) by applying BEOL etchants 702 to the wafer 100. In accordance with aspects of the invention, the BEOL etchants 702 can be wet or dry etchants that, in addition to etching desired portions of the BEOL region 500, can also etch the liners 302 (e.g., in embodiments of the invention where the etched second hard mask 511 is formed from the same material as the liners 302) and/or attack the contacts 304 if any portion of the liners 302 and the contacts 304 is exposed when forming the dual damascene openings/trenches 602, 604. Additionally, because the liners 302 are relatively thin, the liners 302 can be easily stripped by the BEOL etchants 702 to also expose sidewalls of the contacts 304. In accordance with aspects of the invention, even though the conductive material of the multi-segmented protective caps 410 (shown in FIG. 4) does not adhere to the liners 302 and the bulk dielectric material of the MOL layer 301, the selective deposition process of the second protective cap segment 307 is continued until the second protective cap segment 307 is sufficiently pressed against the bulk dielectric material of the MOL layer 301 to prevent the BEOL etchants 702 from passing between the second protective cap segment 307 and the MOL layer 301 to etch the liner 302 positioned underneath the second protective cap segment 307.

Figure 8:
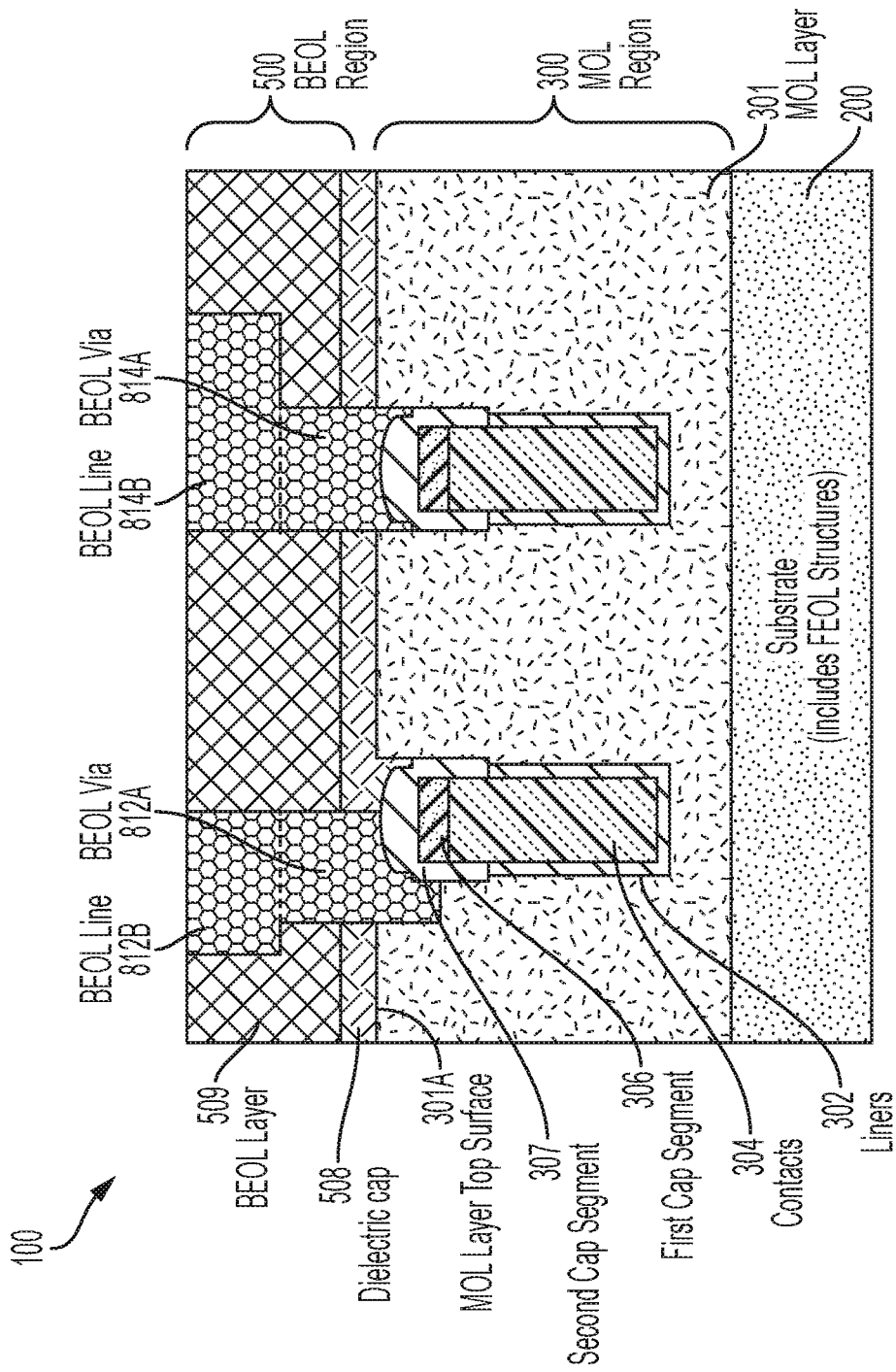

In FIG. 8, known semiconductor fabrication operations have been used to form interconnect structures in the dual damascene openings/trenches 602, 604. In embodiments of the invention, the interconnect structures include BEOL conductive vias 812A, 814A and BEOL conductive lines 812B, 814B, which can be formed by coating the dual damascene openings/trenches 602, 604 (shown in FIG. 7) with a refractory metal barrier such as Ta and $TaN_x$ followed by a thin sputtered metal (e.g., copper) seed layer. The seed layer allows for the electrochemical deposition (ECD) of a thick metal layer that fills up the dual damascene openings/trenches 602, 604, thereby forming the BEOL conductive vias 812A, 814A and BEOL conductive lines 812B, 814B. Excessive metal is removed, and the surface is planarized by chemical mechanical polishing (CMP).

Figure 9A:
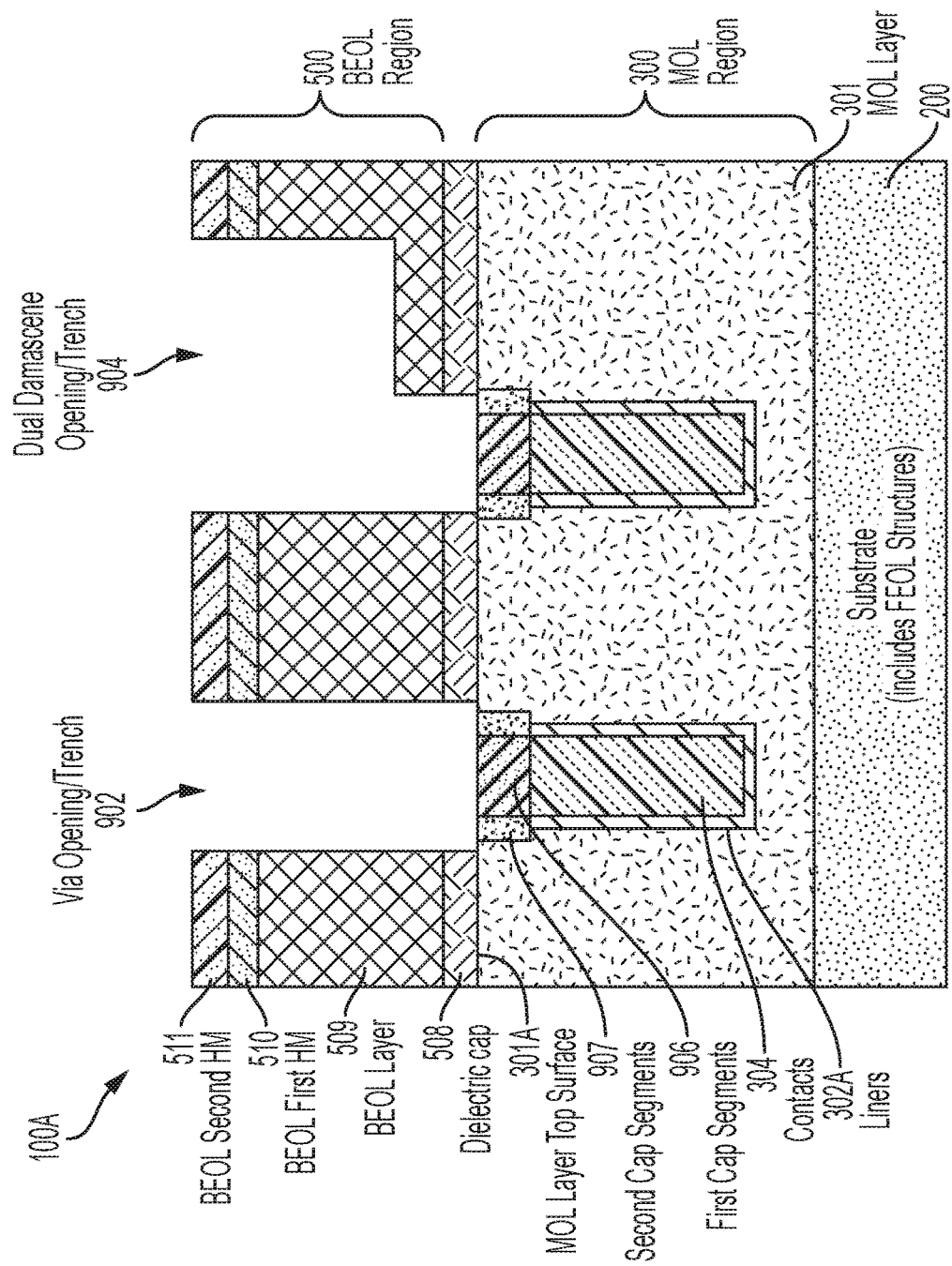
Figure 9B:
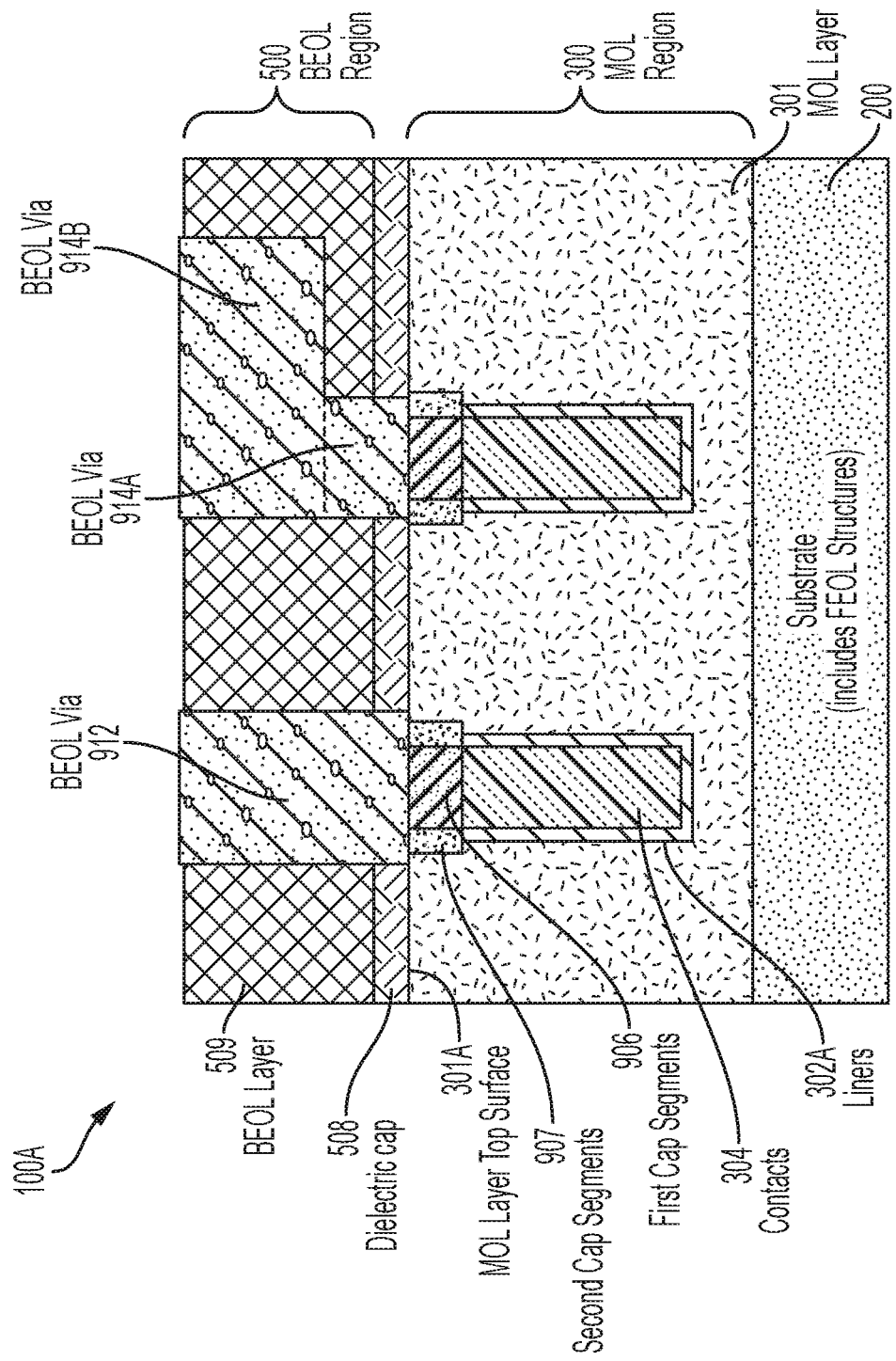

FIGS. 9A-9B depict an IC wafer 100A after various fabrication operations for forming a contact 304, a liner 302A, and a protective cap 907, wherein the protective cap 907 is configured to protect the contacts 304 and the liners 304A during downstream IC fabrication operations in accordance with aspects of the invention. The fabrication operations depicted in FIGS. 9A-9B utilize substantially the same initial fabrication operations that are depicted in FIGS. 1A-2, 5, and 7 that were applied to the IC wafer 100.

Because many of the fabrication operations shown in FIGS. 9A-9B for forming the IC wafer 100A are substantially the same as the fabrication operations shown in FIGS. 1A-2, 5, and 7 for forming the IC wafer 100, many of the same reference numbers used in FIGS. 1A-2, 5, and 7 are used in FIGS. 9A-9B. For structures and/or spaces shown in FIGS. 1A-2, 5, and 7 having the same reference numbers as structures and/or spaces shown in FIGS. 9A-9B, the structures and/or spaces shown in FIGS. 9A-9B have the same features (materials, fabrication method, functional characteristics, etc.) as the corresponding structures and/or spaces shown in FIGS. 1A-2, 5, and 9 unless otherwise specified. For structures and/or spaces shown in FIGS. 9A-9B that, although having a different reference number, are substantially the same as corresponding structures and/or spaces shown in FIGS. 1A-2, 5, and 7, the structures and/or spaces shown in FIGS. 9A-9B have all the same features (materials, fabrication method, functional characteristics, etc.) as the corresponding structures and/or spaces shown in FIGS. 1A-2, 5, and 7 unless otherwise specified.

Prior to the fabrication operations depicted in FIG. 9A, the same fabrication operations used in FIGS. 1A-2 have been applied to the IC wafer 100A to bring the wafer 100A to the same stage shown in FIG. 2, wherein the first protective cap segment 306 shown in FIG. 2 corresponds to the first protective cap segment 907 shown in FIG. 9A. In FIG. 9A, prior to fabrication of the dielectric cap 508 and the BEOL region 500, known fabrication operations have been used to etch the liner layer 302A. In accordance with the aspects of the invention, the liner layer 302A can be etched such that a top surface of the liner layer 302A is substantially co-planar with the contact top surface 305 (shown in FIG. 2), thereby exposing sidewalls of the first protective cap segment 906. The liners 302A can be etched using any suitable dry or wet etching process. Etching the liners 302A forms substantially the same contact openings/trenches 301C shown in FIG. 3 having the shape of a bowl or other open-ended container that has been turned upside down.

Referring still to FIG. 9A, known semiconductor fabrication operations (e.g., electroplating) have been used to deposit second protective cap segments 907 within the openings/trenches 301C (shown in FIG. 3) in accordance with aspects of the invention. In embodiments of the invention, the second protective cap segments 907 function to protect the liners 302A in substantially the same way that the leg sub-segments (or regions) 307C shown in the exploded/isolated view of region 402 shown in FIG. 4 protect the liners 302, also shown in the exploded/isolated view of region 402 shown in FIG. 4.

Referring still to FIG. 9A, after the second protective cap segments 907 are formed, the same fabrication operations depicted in FIG. 5 are used to form the capping layer 508 and the BEOL region 500 shown in FIG. 9A. Additionally, substantially the same fabrication operations used to form the openings/trenches 602, 604 (shown in FIG. 6) have been used to form a via opening/trench 902 and a dual damascene opening/trench 904. For ease of illustration, the via opening/trench 902 and the dual damascene opening/trench 904 are each aligned with underlying respective contacts 304. However, in some embodiments of the invention, either or both of the openings/trenches 902, 904 can be misaligned with respect to its underlying contact 304.

In FIG. 9B, known semiconductor fabrication operations have been used to form interconnect structures in the openings/trenches 902, 904. In embodiments of the invention, the interconnect structures include a BEOL conductive via 912, along with a BEOL conductive via 914A and conductive line 914B, which can be formed by coating the openings/trenches 902, 904 (shown in FIG. 9A) with a refractory metal barrier such as Ta and $TaN_x$ followed by a thin sputtered metal (e.g., copper) seed layer. The seed layer allows for the electrochemical deposition (ECD) of a thick metal layer that fills up the openings/trenches 902, 904, thereby forming the BEOL conductive via 912A, along with the BEOL conductive via 914A and conductive line 914B. Excessive metal is removed, and the surface is planarized by chemical mechanical polishing (CMP).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched, and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a $\{100\}$ orientated crystalline surface can take on a $\{100\}$ orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a multi-layer integrated circuit (IC) structure, the method comprising:
    forming a first layer of the multi-layered IC structure, wherein the first layer comprises a trench having a liner and a conductive interconnect formed in the trench;
    wherein the liner is not on a portion of a sidewall of the conductive interconnect; and
    forming a multi-segmented cap having a first cap segment and a second cap segment;
    wherein the first cap segment is on a top surface of the conductive interconnect;
    wherein a first portion of the second cap segment is on the portion of the sidewall of the conductive interconnect; and
    wherein the second cap segment is on a top surface of the first cap segment.

2. The method of claim 1 further comprising:
    forming a second layer of the multi-layered IC structure over the first layer; and
    forming a third layer of the multi-layered IC structure over the second layer.

3. The method of claim 2 further comprising forming an opening extending through the third layer and the second layer to expose portions of the second cap segment.

4. The method of claim 3 further comprising applying an etchant to the third layer to remove the third layer, wherein the etchant travels through the opening to the exposed portions of the second cap segment, wherein the exposed portions of the second cap segment prevent the etchant from contacting the liner and the portions of the contact.

5. The method of claim 4, wherein the third layer and the liner each comprise the same material.

6. The method of claim 1, wherein each of the first cap segment and the second cap segment comprises tungsten, ruthenium, cobalt or alloys thereof.

7. The method of claim 1, wherein each of the first and the second cap segments comprises different conductive metals or different alloys thereof.

8. The method of claim 1, wherein forming the multi-segmented cap comprises selectively depositing the first cap segment such that:
    the first cap segment adheres to the top surface of the conductive interconnect; and
    the first cap segment does not adhere to the liner.

9. A method of forming a multi-layer integrated circuit (IC) structure, the method comprising:
    forming a first layer of the multi-layered IC structure, wherein the first layer comprises a trench having a liner and a conductive interconnect formed in the trench;
    wherein the liner is not on a portion of a sidewall of the conductive interconnect;
    wherein the liner is not on a portion of a sidewall of the first layer; and
    forming a protective cap by selectively depositing a first segment of the protective cap such that the first segment adheres to a top surface of the conductive interconnect but does not adhere to the liner;
    wherein forming the protective cap further comprises selectively depositing a second segment of the protective cap such that the second segment:
        adheres to a sidewall surface of the conductive interconnect;
        presses against but does not adhere to the portion of the sidewall of the first layer; and
        is positioned over but does not adhere to the liner.

10. The method of claim 9 further comprising:
    forming a second layer of the multi-layered IC structure over the first layer; and
    forming a third layer of the multi-layered IC structure over the second layer.

11. The method of claim 10 further comprising forming an opening extending through the third layer and the second layer to expose portions of the protective cap.

12. The method of claim 11 further comprising applying an etchant to the third layer to remove the third layer, wherein the etchant travels through the opening to the exposed portions of the protective cap segment, wherein the second segment is sufficiently pressed against the portion of the sidewall of the first layer to prevent the etchant from passing between the second segment and the portion of the sidewall of the first layer and contacting the liner.

13. The method of claim 12, wherein the third layer and the liner each comprise the same material.

14. The method of claim 8, wherein each of the first cap and the second cap segments comprises tungsten, ruthenium, cobalt or alloys thereof.

15. The method of claim 9, wherein each of the first and the second cap segments comprises different conductive metals or different alloys thereof.

16. A multi-layer integrated circuit (IC) structure comprising:
    a first layer comprising a trench having a liner and a conductive interconnect formed in the trench;
    wherein the liner is not on a portion of a sidewall of the conductive interconnect;

wherein the liner is not on a portion of a sidewall of the first layer; and a protective cap having a first cap segment and a second cap segment;

wherein the first cap segment of the protective cap is adhered to a top surface of the conductive interconnect but not adhered to the liner;

wherein the second cap segment of the protective cap is:
 adhered to a sidewall surface of the conductive interconnect;
 pressed against but not adhered to the portion of the sidewall of the first layer; and
 positioned over but not adhered to the liner.

17. The structure of claim 16, wherein a top surface of the second cap segment is substantially non-planer.

18. The structure of claim 16, wherein each of the first cap segment and the second cap segment comprises tungsten, ruthenium, cobalt, titanium or alloys thereof.

19. The structure of claim 16, wherein a thickness of the first cap segment is about 1-15 nm.

20. The structure of claim 16, wherein a thickness of the second cap segment is about 1-20 nm.

\* \* \* \* \*